United States Patent
Mikage et al.

(10) Patent No.: US 11,178,755 B2
(45) Date of Patent: Nov. 16, 2021

(54) FLEXIBLE PRINTED CIRCUIT BOARD, METHOD FOR PRODUCING CONNECTION BODY, AND CONNECTION BODY

(71) Applicants: SUMITOMO ELECTRIC INDUSTRIES, LTD., Osaka (JP); SUMITOMO ELECTRIC PRINTED CIRCUITS, INC., Koka (JP)

(72) Inventors: Katsunari Mikage, Osaka (JP); Masamichi Yamamoto, Osaka (JP); Junichi Okaue, Koka (JP); Hiroshi Ueda, Koka (JP)

(73) Assignees: SUMITOMO ELECTRIC INDUSTRIES, LTD., Osaka (JP); SUMITOMO ELECTRIC PRINTED CIRCUITS, INC., Koka (JP)

( * ) Notice: Subject to any disclaimer, the term of this patent is extended or adjusted under 35 U.S.C. 154(b) by 444 days.

(21) Appl. No.: 16/080,759

(22) PCT Filed: Nov. 15, 2017

(86) PCT No.: PCT/JP2017/041019
§ 371 (c)(1),
(2) Date: Aug. 29, 2018

(87) PCT Pub. No.: WO2018/159023
PCT Pub. Date: Sep. 7, 2018

(65) Prior Publication Data
US 2021/0059045 A1    Feb. 25, 2021

(30) Foreign Application Priority Data
Mar. 1, 2017  (JP) .............................. JP2017-038812

(51) Int. Cl.
H05K 1/00    (2006.01)
H05K 1/02    (2006.01)
H05K 3/32    (2006.01)

(52) U.S. Cl.
CPC ............. *H05K 1/0281* (2013.01); *H05K 3/32* (2013.01)

(58) Field of Classification Search
CPC .............................. H05K 1/0281; H05K 3/32
USPC ....................................................... 174/254
See application file for complete search history.

(56) References Cited

U.S. PATENT DOCUMENTS

| | | | |
|---|---|---|---|
| 6,596,947 B1 | 7/2003 | Kurita et al. | |
| 2005/0263909 A1 | 12/2005 | Fukuta et al. | |
| 2015/0340120 A1* | 11/2015 | Ishizawa ................ | C08G 59/40 |
| | | | 361/760 |

FOREIGN PATENT DOCUMENTS

| | | | |
|---|---|---|---|
| CN | 1707779 A | | 12/2005 |
| JP | H03-291950 A | * | 12/1991 |
| JP | H04-133344 A | * | 12/1991 |
| JP | H04-133344 A | | 5/1992 |
| JP | 2000-208903 A | | 7/2000 |
| JP | 2003-249734 A | | 9/2003 |

(Continued)

*Primary Examiner* — Andargie M Aychillhum
(74) *Attorney, Agent, or Firm* — Faegre Drinker Biddle & Reath LLP

(57) ABSTRACT

A flexible printed circuit board of the present invention includes an insulating base film and an electrode stacked on a first surface of the base film, in which the electrode includes a low-melting-point metal layer on a surface of the electrode, and a plate- or strip-like rigid member electrically insulated from the electrode is disposed in a region of a second surface of the base film opposite from the electrode.

8 Claims, 5 Drawing Sheets

(56) References Cited

FOREIGN PATENT DOCUMENTS

| | | |
|---|---|---|
| JP | 2011-253926 A | 12/2011 |
| WO | WO 01/56340 A | 8/2001 |

* cited by examiner

FLEXIBLE PRINTED CIRCUIT BOARD, METHOD FOR PRODUCING CONNECTION BODY, AND CONNECTION BODY

TECHNICAL FIELD

The present invention relates to a flexible printed circuit board, a method for producing a connection body, and a connection body.

The present application claims priority to Japanese Patent Application No. 2017-038812 filed in the Japan Patent Office on Mar. 1, 2017, which is hereby incorporated by reference herein in its entirety.

BACKGROUND ART

Flexible printed circuit boards are widely used to make electric circuits such as electronic components. A flexible printed circuit board includes, for example, a base film and electrodes that are stacked on a surface of the base film and that have low-melting-point metal layers on outer surfaces thereof. The flexible printed circuit board is hot-pressed on an electronic component to connect the electrodes of the flexible printed circuit board and electrodes of an electronic component with an alloy, thereby electrically connecting the flexible printed circuit board to the electronic component (see Japanese Unexamined Patent Application Publication No. 2000-208903).

CITATION LIST

Patent Literature

PTL 1: Japanese Unexamined Patent Application Publication No. 2000-208903

SUMMARY OF INVENTION

According to an aspect of the present invention, a flexible printed circuit board includes an insulating base film and an electrode stacked on a first surface of the base film, in which the electrode includes a low-melting-point metal layer on a surface of the electrode, and a plate- or strip-like rigid member electrically insulated from the electrode is disposed in a region of a second surface of the base film opposite from the electrode.

According to another aspect of the present invention, a method for producing a connection body that includes the flexible printed circuit board and an electronic component including another electrode electrically connected to the electrode of the flexible printed circuit board includes a hot-pressing step of hot-pressing the flexible printed circuit board and the electronic component together.

According to another aspect of the present invention, a connection body includes the flexible printed circuit board and an electronic component including another electrode electrically connected to the electrode of the flexible printed circuit board, in which the electrode of the flexible printed circuit board and the electrode of the electronic component are bonded together with an alloy.

DESCRIPTION OF EMBODIMENTS

Problem to be Solved by Disclosure

Figure 7:
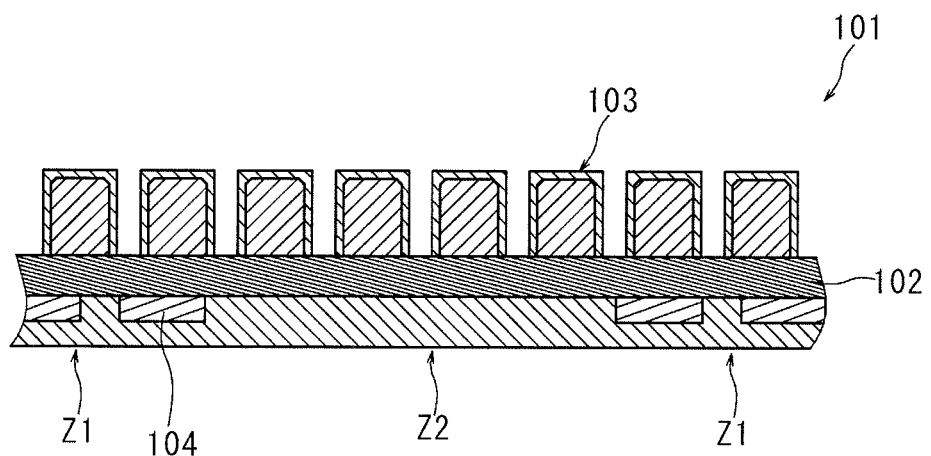
FIG. 7 is a schematic partial cross-sectional view illustrating a conventional flexible printed circuit board.

The flexible printed circuit board described in the patent literature is a multilayer flexible printed circuit board including a circuit pattern on a side of the base film opposite that on which the electrodes are disposed. As illustrated in FIG. 7, such a flexible printed circuit board 101 includes, on the other surface of the base film 102, a circuit pattern formation region Z1 where a circuit pattern 104 opposite from the electrodes 103 is disposed, and a circuit pattern-free region Z2 where the circuit pattern 104 opposite from the electrodes 103 is not disposed.

Thus, when the flexible printed circuit board 101 is hot-pressed to the electronic component, a pressure applied to the electrodes of the electronic component and the electrodes 103 located in a portion corresponding to the circuit pattern-free region Z2 is lower than that applied to the electrodes of the electronic component and the electrodes 103 located in a portion corresponding to the circuit pattern formation region Z1. That is, in the flexible printed circuit board 101, because the base film 102 is flexible and soft, the deflection or the like of a portion of the base film 102 corresponding to the circuit pattern-free region Z2 occurs during the hot pressing, thus decreasing the pressure applied to the electrodes of the electronic component and the electrodes 103 located in the positions corresponding to the circuit pattern-free region Z2.

Figure 8:
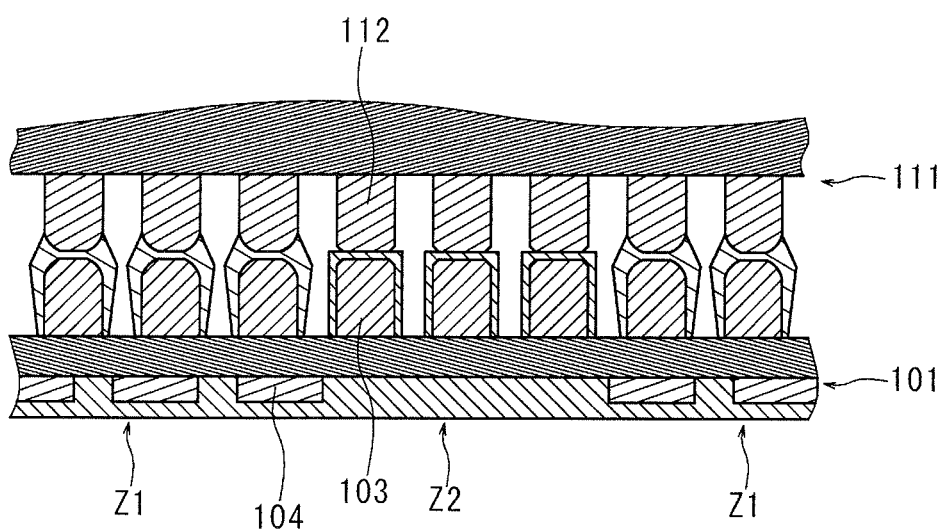
FIG. 8 is a schematic partial cross-sectional view illustrating a state after a hot-pressing step in a method for producing a connection body using the flexible printed circuit board illustrated in FIG. 7.

In the flexible printed circuit board 101 as illustrated in FIG. 8, the bonding strength between the electrodes 112 of an electronic component 111 and the electrodes 103 in the positions corresponding to the circuit pattern-free region Z2 is decreased to easily lead to insufficient bonding strength between the electrodes located in the portion corresponding to the circuit pattern-free region Z2.

The present invention has been accomplished in light of the foregoing circumstances. It is an object of the present invention to provide a flexible printed circuit board capable of providing sufficiently high bonding strength between the flexible printed circuit board and an electronic component. It is another object of the present invention to provide a method for producing a connection body having sufficiently high bonding strength between electrodes, and a connection body.

Advantageous Effects of Invention

The flexible printed circuit board according to the present invention is capable of providing sufficiently high bonding strength between the flexible printed circuit board and an electronic component. By the method according to the present invention for producing a connection body, the connection body having sufficiently high bonding strength between the electrodes can be produced. The connection body according to the present invention has sufficiently high bonding strength between the electrodes.

DESCRIPTION OF EMBODIMENTS OF INVENTION

Embodiments of the present invention are first listed and explained.

A flexible printed circuit board according to an embodiment of the present invention includes an insulating base film and an electrode stacked on a first surface of the base film, in which the electrode includes a low-melting-point metal layer on a surface of the electrode, and a plate- or strip-like rigid member electrically insulated from the electrode is disposed in a region of a second surface of the base film opposite from the electrode.

The flexible printed circuit board includes the plate- or strip-like rigid member electrically insulated from the electrode in the region of the second surface of the base film opposite from the electrode; thus, the rigidity of the region of the second surface of the base film opposite from the electrode can be increased without affecting the electrical connection structure of the electrode. When the electrode of the flexible printed circuit board and another electrode of an electronic component are bonded together by, for example, hot pressing, the deflection or the like of the base film toward the second surface can be inhibited to sufficiently increase the bonding strength between the electrodes.

Preferably, the flexible printed circuit board further includes a circuit pattern disposed on the second surface of the base film, in which the rigid member is disposed at a position that does not overlap the circuit pattern when viewed in plan while the rigid member is electrically insulated from the circuit pattern. As just described, in the case where the flexible printed circuit board further includes the circuit pattern disposed on the second surface of the base film and where the rigid member is disposed at a position that does not overlap the circuit pattern when viewed in plan while the rigid member is electrically insulated from the circuit pattern, the uniformity of a pressure during hot pressing can be improved by the rigid member and the circuit pattern, thus easily and reliably increasing the overall bonding strength between the electrode of the flexible printed circuit board and the electrode of an electronic component.

Preferably, the electrode is linearly disposed when viewed in plan, the rigid member is a dummy circuit disposed parallel or perpendicularly to the electrode when viewed in plan, and the average spacing between adjacent traces of the dummy circuit is 200 μm or less. As just described, in the case where the electrode is linearly disposed when viewed in plan, the rigid member is the dummy circuit disposed parallel or perpendicularly to the electrode when viewed in plan, and where the average spacing between adjacent traces of the dummy circuit is 200 μm or less, the use of the rigid member easily improves the uniformity of a pressure during the hot pressing to further increase the overall bonding strength between the electrode of the flexible printed circuit board and the electrode of an electronic component.

A method according to another embodiment of the present invention for producing a connection body that includes the flexible printed circuit board and an electronic component including another electrode electrically connected to the electrode of the flexible printed circuit board includes a hot-pressing step of hot-pressing the flexible printed circuit board and the electronic component together.

Because the method for producing a connection body includes the hot-pressing step of hot-pressing the flexible printed circuit board and an electronic component, a connection body having sufficiently high bonding strength between the electrode of the flexible printed circuit board and the electrode of the electronic component can be produced.

A connection body according to another embodiment of the present invention includes the flexible printed circuit board and an electronic component including another electrode electrically connected to the electrode of the flexible printed circuit board, in which the electrode of the flexible printed circuit board and the electrode of the electronic component are bonded together with an alloy.

In the connection body, the electrode of the flexible printed circuit board and the electrode of the electronic component are bonded together with the alloy; thus, the bonding strength between the electrodes is sufficiently high.

The term "rigid member" used in the present invention refers to a member having a higher rigidity than the base film.

Details of Embodiments of Invention

Preferred embodiments of the present invention are described below with reference to the drawings.

[Flexible Printed Circuit Board]

Figure 1:
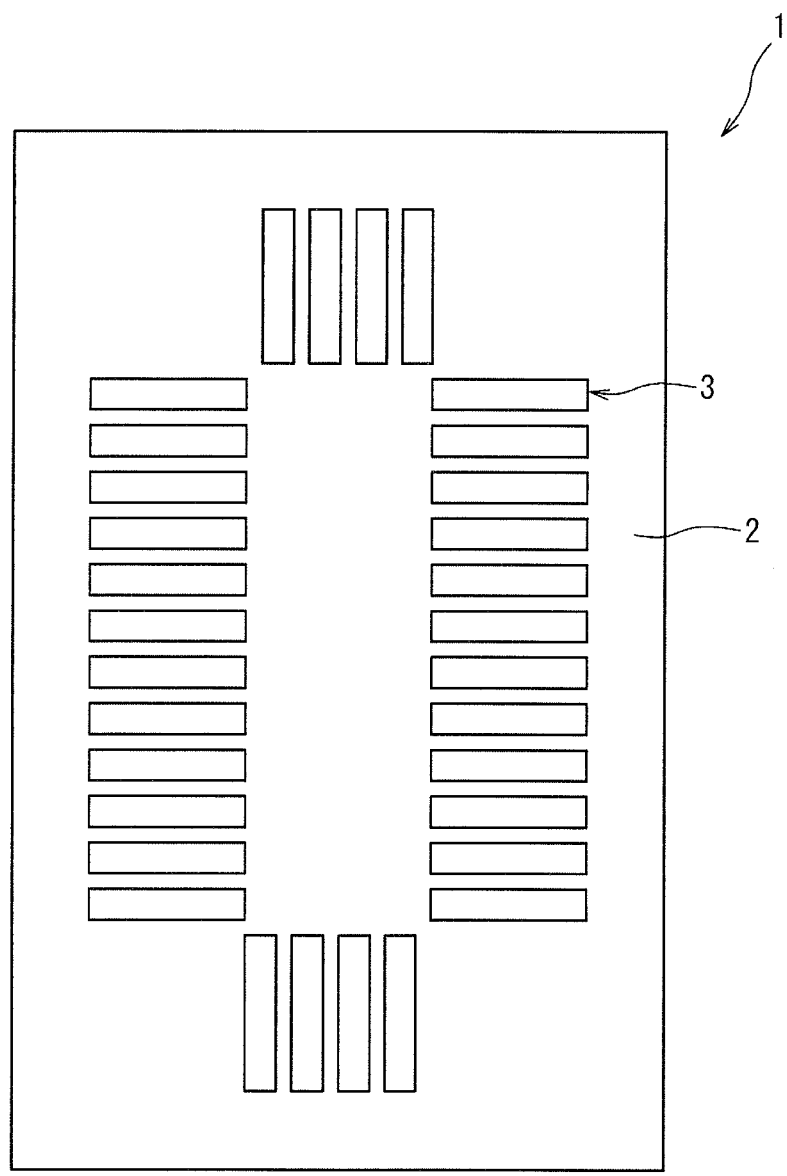
FIG. 1 is a schematic plan view illustrating a flexible printed circuit board according to an embodiment of the present invention.
Figure 2:
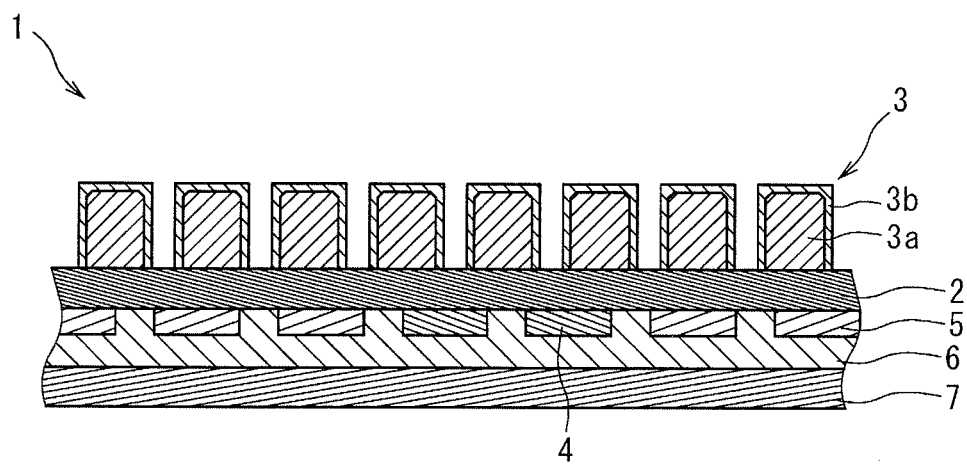
FIG. 2 is a schematic partial cross-sectional view of the flexible printed circuit board illustrated in FIG. 1.

A flexible printed circuit board 1 illustrated in FIGS. 1 and 2 includes an insulating base film 2 and electrodes 3 stacked on a first surface of the base film 2. The flexible printed circuit board 1 includes plate- or strip-like rigid members 4 electrically insulated from the electrodes 3, the rigid members 4 being disposed in a region of a second surface of the base film 2 opposite from the electrode 3. In the flexible printed circuit board 1, a first circuit pattern (not illustrated) is stacked on the first surface of the base film 2, and an adhesive layer and a cover layer (neither illustrated) are stacked on the outer-surface side of the first circuit pattern. The flexible printed circuit board 1 includes land portions of the first circuit pattern exposed at predetermined positions on an outer surface. The land portions constitute main bodies 3a of the electrodes 3. The main bodies 3a are exposed on the outer-surface side by, for example, removing the adhesive layer and the cover layer in a predetermined region of the base film 2. Each of the electrodes 3 includes the main body 3a formed of a corresponding one of the land portions and a low-melting-point metal layer 3b that is stacked on a surface of the main body 3a and that constitutes the outermost surface of the main body 3a. The flexible printed circuit board 1 is configured to be able to form a connection body by hot pressing with an electronic component, such as an IC chip, to bond the electrodes 3 to the electrodes of the electronic component with an alloy. The term "low-melting-point metal layer" refers to a layer containing, as a main component, a metal having a lower melting point than the main bodies 3*a*. The term "main component" refers to a component whose content is highest and, for example, indicates a component whose content is 50% or more by mass.

The flexible printed circuit board 1 includes a circuit pattern (second circuit pattern 5), the rigid members 4, an adhesive layer 6, and a cover layer 7 on the side of a second surface of the base film 2. One surface of the adhesive layer 6 is in contact with the rigid members 4, the second circuit pattern 5, and a region of the base film 2 on which none of the rigid members 4 and the second circuit pattern 5 are stacked. The cover layer 7 is stacked on the other surface of the adhesive layer 6.

(Base Film)

The base film 2 is flexible and soft. The base film 2 contains a synthetic resin as a main component. Examples of the main component of the base film 2 include soft materials such as polyimides, liquid-crystal polyesters, poly(ethylene terephthalate), poly(ethylene naphthalate), and fluororesins. Of these, a polyimide is preferred because of its good insulation, flexibility, and heat resistance. The base film 2 may be porous and may contain a filler, an additive, and so forth.

The thickness of the base film 2 is not particularly limited. For example, the lower limit of the average thickness of the base film 2 is preferably 5 µm, more preferably 12 µm. The upper limit of the average thickness of the base film 2 is preferably 2 mm, more preferably 1.6 mm. If the base film 2 has an average thickness of smaller than the lower limit, the base film 2 may have insufficient strength. If the base film 2 has an average thickness of larger than the upper limit, a difficulty may lie in using the base film 2 for electronic devices required to have a smaller thickness, and the base film 2 may have insufficient flexibility.

(Electrode)

As described above, the main bodies 3*a* of the electrodes 3 are formed of the land portions of the first circuit pattern exposed at the outer surface at the predetermined positions and are composed of the same material as that of the first circuit pattern. The main component of the main bodies 3*a* is not particularly limited as long as it is conductive. Examples thereof include copper, silver, platinum, and nickel. Surfaces of the main bodies 3*a* may be subjected to plating. The main bodies 3*a* may be formed by a subtractive process including, for example, stacking a metal layer on the first surface of the base film 2 using metal foil, metal evaporation, sintering of fine metal particles, or the like, masking the metal layer with, for example, a resist pattern, and etching the metal layer, or by semi-additive process. The main bodies 3*a* may be formed by the application of, for example, paste or ink containing a metal such as copper, silver, or nickel. To improve adhesion to the main bodies 3*a*, the first surface of the base film 2 may be subjected to surface treatment such as hydrophilization treatment, as needed.

The low-melting-point metal layers 3*b* are plating layers formed by subjecting the surfaces of the main bodies 3*a* to plating using tin (Sn) as a main component, for example. Each of the low-melting-point metal layers 3*b* may be stacked at least on a side of a corresponding one of the main bodies 3*a* opposite from the stacking surfaces of the main bodies 3*a* on the base film 2. To sufficiently increase the bonding strength to an electronic component (not illustrated), each low-melting-point metal layer 3*b* is preferably stacked on all surfaces of the corresponding main body 3*a* other than the stacking surface of the main body 3*a* on the base film 2.

The electrodes 3 have a substantially uniform thickness over the entire region. The lower limit of the average thickness of each electrode 3 is preferably 2 µm, more preferably 5 µm. The upper limit of the average thickness of the electrode 3 is preferably 50 µm, more preferably 40 µm. If the average thickness is smaller than the lower limit, the electrodes 3 may not be easily bonded to the electrodes of an electronic component. If the average thickness is larger than the upper limit, the electrodes 3 are unnecessarily thick, possibly failing to sufficiently promote a reduction in the thickness of the flexible printed circuit board 1. The term "average thickness" refers to the average of thickness values measured at freely-selected 10 points.

Each of the electrodes 3 has, for example, a linear shape when viewed in plan. The flexible printed circuit board 1 includes the plural electrodes 3 on the first surface of the base film 2. The plural electrodes 3 are arranged in a substantially rectangular ring shape as a whole. The direction of extension of each of the linear portions of the rectangular ring shape is parallel to the width direction of the electrodes 3 arranged thereat. The electrodes 3 are arranged at substantially equal pitches in the direction of extension of each of the linear portions of the rectangular ring shape. The lower limit of the average pitch of the electrodes 3 in each linear portion is preferably 12 µm, more preferably 15 µm. The upper limit of the average pitch is preferably 120 µm, more preferably 100 µm. If the average pitch is smaller than the lower limit, adjacent electrodes 3 may short-circuit. If the average pitch is larger than the upper limit, the bonding region of the flexible printed circuit board 1 is unnecessarily large, possibly failing to sufficiently promote a reduction in the size of the flexible printed circuit board 1.

The term "average pitch" refers to the average of pitch values measured at freely-selected 10 points.

The plural electrodes 3 have a substantially equal width. The lower limit of the average width of the plural electrodes 3 is preferably 3 µm, more preferably 5 µm. The upper limit of the average width is preferably 100 µm, more preferably 80 µm. If the average width is smaller than the lower limit, the bonding strength to the electrodes of an electronic component may not be sufficient. If the average width is larger than the upper limit, the bonding region of the flexible printed circuit board 1 is unnecessarily large, possibly failing to sufficiently promote a reduction in the size of the flexible printed circuit board 1.

Each of the low-melting-point metal layers 3*b* is disposed in a substantially uniform thickness on the surface of a corresponding one of the main bodies 3*a*. The lower limit of the average thickness of each low-melting-point metal layer 3*b* is preferably 0.05 µm, more preferably 0.10 µm. The upper limit of the average thickness of the low-melting-point metal layer 3*b* is preferably 5.0 µm, more preferably 2.0 µm. If the average thickness is smaller than the lower limit, the bonding strength to the electrodes of an electronic component may be insufficient. If the average thickness is larger than the upper limit, the amount of low-melting metal is unnecessarily large, possibly short-circuiting adjacent electrodes 3 while the electrodes 3 are bonded to the electronic component.

(Second Circuit Pattern)

The second circuit pattern 5 is disposed on at least part of a region opposite from the electrodes 3 when viewed in plan. The second circuit pattern 5 may be formed by a subtractive process including, for example, stacking a metal layer on the second surface of the base film 2 using metal foil, metal evaporation, sintering of fine metal particles, or the like, masking the metal layer with, for example, a resist pattern, and etching the metal layer, or by semi-additive process. The second circuit pattern 5 may be formed by the application of, for example, paste or ink containing a metal such as copper, silver, or nickel. To improve the adhesion of the second circuit pattern 5, the second surface of the base film 2 may be subjected to surface treatment such as hydrophilization treatment, as needed.

The arrangement pattern of traces of the second circuit pattern 5 is not particularly limited and can be appropriately designed, as needed. However, the traces of the second circuit pattern 5 are preferably arranged in parallel in such a manner that the axis thereof is parallel to the longitudinal direction of the electrodes 3 in the region opposite from the electrodes 3 when viewed in plan. The traces of the second circuit pattern 5 may be arranged in parallel in such a manner that the axis thereof is perpendicular to the longitudinal direction of the electrodes 3 in the region opposite from the electrodes 3 when viewed in plan. The traces of the second circuit pattern 5 are preferably arranged at equal pitches in the region opposite from the electrodes 3 when viewed in plan.

The second circuit pattern 5 preferably has a substantially uniform thickness at least in the region opposite from the electrodes 3. The second circuit pattern 5 may have an average thickness of, for example, 2 μm or more and 50 μm or less. In the case where the traces of the second circuit pattern 5 are arranged in parallel in the region opposite from the electrodes 3 when viewed in plan in such a manner that the axis thereof is parallel or perpendicular to the longitudinal direction of the electrodes 3, the upper limit of the average spacing between adjacent traces is preferably 200 more preferably 150 The lower limit of the average spacing between adjacent traces may be, for example, 10 μm.

(Rigid Member)

The rigid members 4 are preferably disposed at positions that do not overlap the second circuit pattern 5 when viewed in plan while the rigid members 4 are electrically insulated from the second circuit pattern 5. In the case where the rigid members 4 are disposed at the positions that do not overlap the second circuit pattern 5 when viewed in plan while the rigid members 4 are electrically insulated from the second circuit pattern 5, the uniformity of a pressure during the hot pressing can be improved by the rigid members 4 and the second circuit pattern 5, thus easily and reliably increasing the overall bonding strength between the electrodes 3 of the flexible printed circuit board 1 and the electrodes of an electronic component.

The rigid members 4 are directly stacked on the second surface of the base film 2 and are right opposite the electrodes 3 with the base film 2 therebetween. Because the rigid members 4 are directly stacked on the second surface of the base film 2, a decrease in pressure applied to the electrodes 3 due to the flexibility and softness of the base film 2 during the hot pressing is easily inhibited.

The rigid members 4 are directly stacked on the second surface of the base film 2. The rigid members 4 and the second circuit pattern 5 are arranged in the same layer. Because the rigid members 4 and the second circuit pattern 5 are arranged in the same layer, the uniformity of a pressure applied to the electrodes 3 during the hot pressing is easily improved by the rigid members 4 and the second circuit pattern 5. This inhibits variations in the bonding strength of the electrodes 3 and facilitates the more accurate bonding between the flexible printed circuit board 1 and an electronic component with more sufficient strength.

The lower limit of the average thickness of the rigid members 4 is preferably 2 more preferably 5 μm. The upper limit of the average thickness of the rigid members 4 is preferably 50 μm, more preferably 40 μm. If the average thickness is smaller than the lower limit, the rigidity of the base film may fail to be sufficiently enhanced. If the average thickness is larger than the upper limit, the rigid members 4 are unnecessarily thick, possibly failing to sufficiently promote a reduction in the thickness of the flexible printed circuit board 1.

To improve the uniformity of the pressure applied to the electrodes 3, the rigid members 4 and the second circuit pattern 5 preferably have the same thickness. Specifically, the upper limit of the difference (absolute value) in average thickness between the rigid members 4 and the second circuit pattern 5 is preferably 5 μm, more preferably 3 μm. A smaller difference in average thickness is more preferred. The lower limit thereof may be 0 μm.

Figure 3:
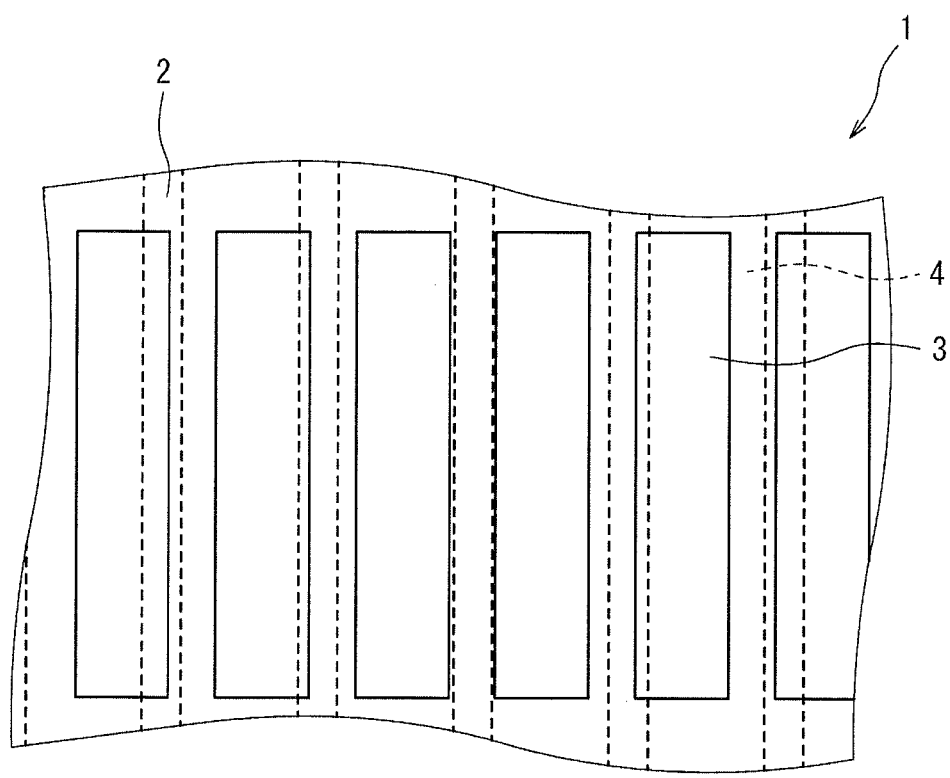
FIG. 3 is an enlarged schematic plan view illustrating the positional relationship between electrodes and rigid members of the flexible printed circuit board illustrated in FIG. 1.
Figure 4:
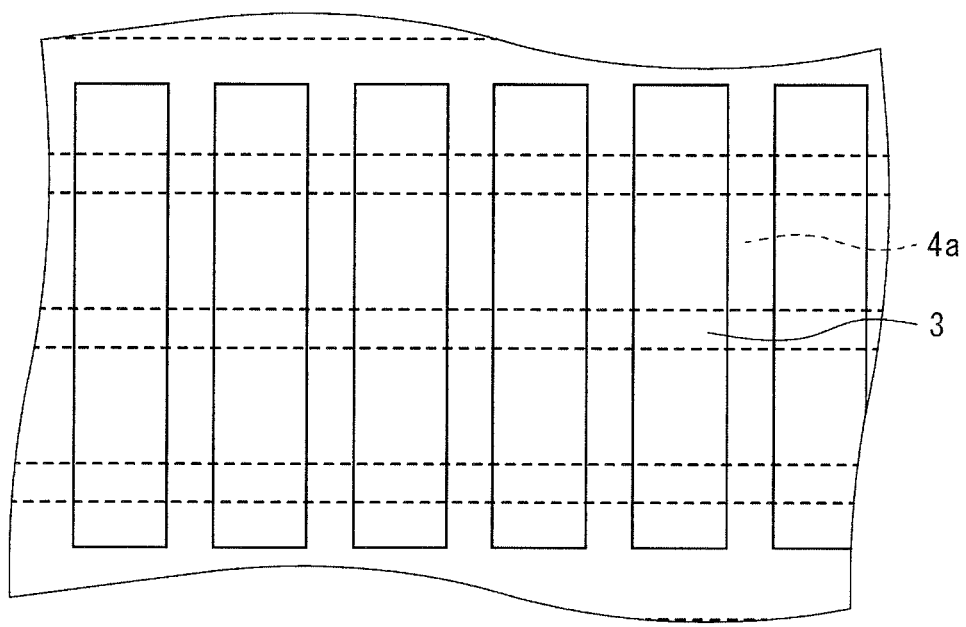
FIG. 4 is an enlarged schematic plan view illustrating the modification of the positional relationship between the electrodes and the rigid members illustrated in FIG. 3.

A material of the rigid members 4 is not particularly limited as long as the rigidity of the rigid members 4 can be maintained at a higher level than that of the base film 2. Examples thereof include glass epoxy and metals. In the flexible printed circuit board 1, for example, a rectangular sheet of the rigid member 4 when viewed in plan may be stacked on the second surface of the base film 2. Here, the rigid members 4 are preferably a dummy circuit having traces arranged in parallel. That is, the flexible printed circuit board 1 preferably includes the plural linear rigid members 4 arranged in parallel in a region opposite from the electrodes 3 when viewed in plan. In this case, the plural rigid members 4 and the second circuit pattern 5 are preferably arranged so as to extend over the entire region of the second surface of the base film 2 opposite from the electrodes 3. As illustrated in FIG. 3, the plural rigid members 4 are preferably arranged parallel to the electrodes 3 when viewed in plan. As illustrated in FIG. 4, plural rigid members 4a may be arranged perpendicularly to the electrodes 3 when viewed in plan.

In the case where the rigid members 4 serve as the dummy circuit having the trances arranged in parallel in such a manner that the axis thereof is parallel or perpendicular to the longitudinal direction of the electrodes 3 at least in the region opposite from the electrodes 3, the upper limit of the average spacing between adjacent traces of the dummy circuit is preferably 200 μm, more preferably 150 μm. If the average spacing is more than the upper limit, the uniformization of the pressure applied to the electrodes 3 during the hot pressing may fail to be sufficiently promoted. In contrast, when the average spacing is equal to or less than the upper limit, the use of the rigid members 4 easily improves the uniformity of the pressure during the hot pressing to easily increase the overall bonding strength between the electrodes of the flexible printed circuit board 1 and the electrodes of an electronic component. The lower limit of the average spacing may be, for example, 10 μm.

In the case where the rigid members 4 serve as the dummy circuit having the trances arranged in parallel in such a manner that the axis thereof is parallel or perpendicular to the longitudinal direction of the electrodes 3 at least in the region opposite from the electrodes 3, the rigid members 4 are preferably arranged parallel to the second circuit pattern 5 in the region opposite from the electrodes 3 when viewed in plan. In this case, the dummy circuit and the second circuit pattern 5 preferably have the same spacing between adjacent traces. The upper limit of the average spacing between adjacent traces of the dummy circuit and the second circuit pattern 5 is preferably 200 μm, more preferably 150 μm. When the average spacing is equal to or less than the upper limit, the use of the rigid members 4 and the second circuit pattern 5 easily improves the uniformity of the pressure during the hot pressing. The lower limit of the average spacing may be, for example, 10 μm.

When the rigid members 4 serve as the dummy circuit, the main component of the rigid members 4 is preferably identical to the main component of the second circuit pattern 5. In this case, because the main component of the rigid members 4 is identical to the main component of the second circuit pattern 5, the rigid members 4 and the second circuit pattern 5 can be simultaneously formed by the same method, thereby facilitating the production of the flexible printed circuit board 1. Because the main component of the rigid members 4 is identical to the main component of the second circuit pattern 5, the uniformity of the pressure applied to the electrodes 3 during the hot pressing is easily improved.

When the rigid members 4 serve as the dummy circuit, the lower limit of the average width of the rigid members 4 is preferably 10 μm, more preferably 20 μm. The upper limit of the average width is preferably 100 μm, more preferably 70 If the average width is less than the lower limit, a difficulty may lie in sufficiently increasing the rigidity of the base film. If the average width is more than the upper limit, the flexibility of the flexible printed circuit board 1 may be impaired.

(Adhesive Layer)

An adhesive constituting the adhesive layer 6 is preferably, but not particularly limited to, an adhesive having good flexibility and heat resistance. Examples thereof include various resin-based adhesives composed of, for example, nylon resins, epoxy resins, butyral resins, and acrylic resins. The average thickness of the adhesive layer 6 is preferably, but not necessarily, 20 μm or more and 70 μm or less. An average thickness of the adhesive layer 6 of less than the lower limit may lead to insufficient adhesion. An average thickness of the adhesive layer 6 of more than the upper limit may lead to insufficient flexibility of the flexible printed circuit board 1.

(Cover Layer)

The cover layer 7 is insulating. The cover layer 7 is a resin layer composed of a synthetic resin as a main component. The main component of the cover layer 7 is not particularly limited and may be the same as the main component of the base film 2. The lower limit of the average thickness of the cover layer 7 is preferably 5 μm, more preferably 10 μm. The upper limit of the average thickness of the cover layer 7 is preferably 60 μm, more preferably 40 pin. An average thickness of the cover layer 7 of smaller than the lower limit may lead to insufficient insulation. An average thickness of the cover layer 7 of larger than the upper limit may lead to insufficient flexibility of the flexible printed circuit board 1.

<Advantage>

The flexible printed circuit board 1 includes the plate- or strip-like rigid members 4 electrically insulated from the electrodes 3 in the region of the second surface of the base film 2 opposite from the electrodes 3; thus, the rigidity of the region of the second surface of the base film 2 opposite from the electrodes 3 can be increased without affecting the electrical connection structure of the electrodes 3. When the electrodes 3 of the flexible printed circuit board 1 and other electrodes of an electronic component are bonded together by, for example, hot pressing, the deflection or the like of the base film toward the second surface can be inhibited to sufficiently increase the bonding strength between the electrodes.

[Method for Producing Connection Body]

A method for producing a connection body 21 that includes the flexible printed circuit board 1 illustrated in FIG. 1 and an electronic component 11 including other electrodes 13 electrically connected to the electrodes 3 of the flexible printed circuit board 1 will be described below with reference to FIGS. 5 and 6. The method for producing a connection body includes a hot-pressing step of hot-pressing the flexible printed circuit board 1 and the electronic component 11 together. The electronic component 11 connected to the flexible printed circuit board 1 will first be described.

<Electronic Component>

The electronic component 11 is, for example, a semiconductor chip such as IC chip. The electronic component 11 includes a substrate 12 and the electrodes 13 stacked on the substrate 12. The electrodes 13 having substantially the same shape as the electrodes 3 of the flexible printed circuit board 1 when viewed in plan are arranged at substantially the same spacing as that of the electrodes 3 of the flexible printed circuit board 1 when viewed in plan in such a manner that the outer surfaces of the electrodes 13 can abut against the respective outer surfaces of the electrodes 3 of the flexible printed circuit board 1. Examples of a material for the substrate 12 include, but are not particularly limited to, rigid materials such as glass epoxy and flexible materials such as synthetic resins. Of these, a rigid material, which achieves an ease of the application of a uniform pressure during the hot pressing, is preferred. Examples of the main component of the electrodes 13 include metals such as gold, silver, tin, and nickel. Of these, gold (Au) is preferred because it can be easily and reliably bonded to the electrodes 3 of the flexible printed circuit board 1 by Au—Sn eutectic bonding. As the structure of the electrodes 13 of the electronic component 11 which can be bonded to the electrodes 3 of the flexible printed circuit board 1 by the Au—Sn eutectic bonding, for example, a structure in which gold-plating layers are stacked on the outer surfaces of the main bodies of the electrodes may be used.

(Hot-Pressing Step)

Figure 5:
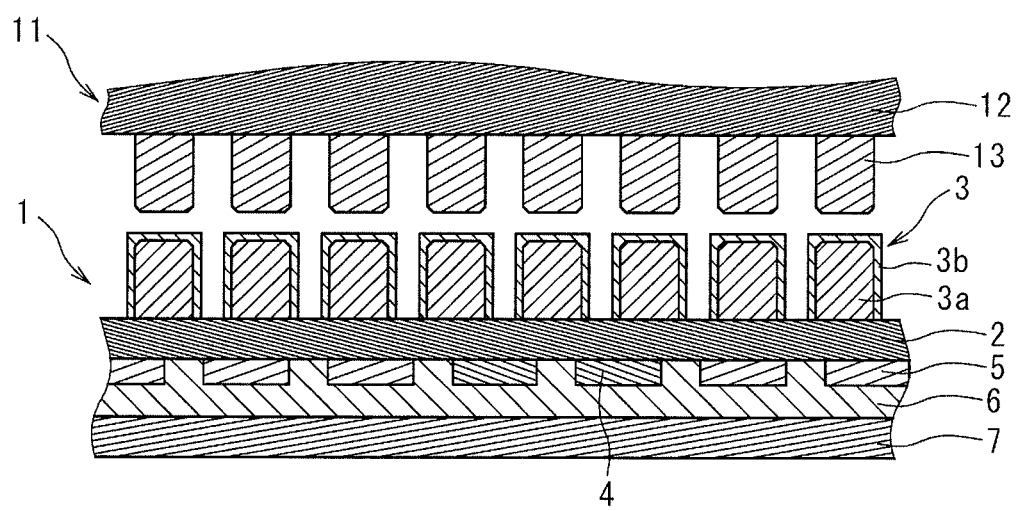
FIG. 5 is a schematic partial cross-sectional view illustrating a hot-pressing step in a method for producing a connection body using the flexible printed circuit board illustrated in FIG. 1.
Figure 6:
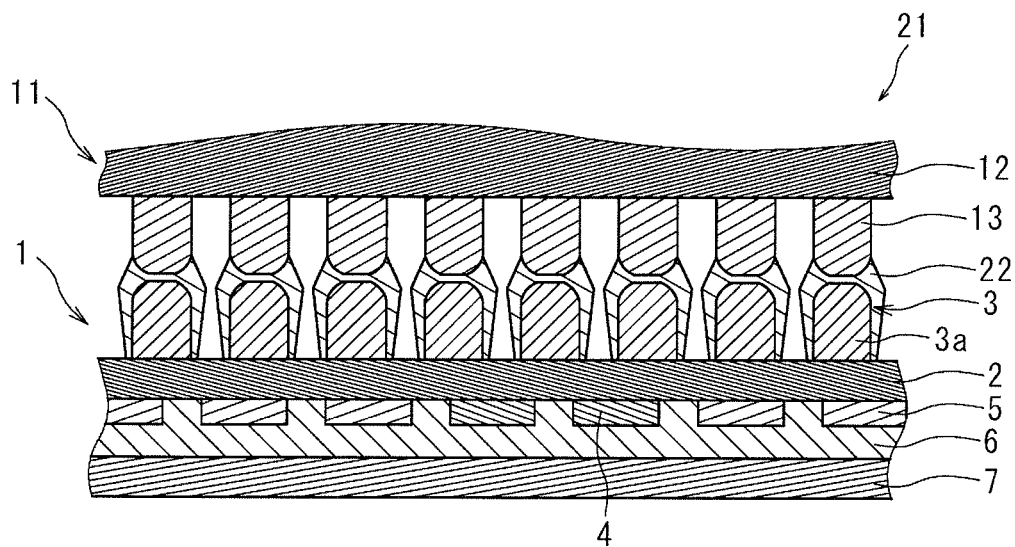
FIG. 6 is a schematic partial cross-sectional view illustrating a state after the hot-pressing step in the method for producing a connection body using the flexible printed circuit board illustrated in FIG. 1.

In the hot-pressing step, as illustrated in FIG. 5, the flexible printed circuit board 1 and the electronic component 11 are hot-pressed together while the outer surfaces of the electrodes 3 of the flexible printed circuit board 1 are opposite the outer surfaces of the electrodes 13 of the electronic component 11. In the hot-pressing step, the low-melting-point metal layers 3b of the flexible printed circuit board 1 and part of the outer-surface side portions of the electrodes 13 of the electronic component 11 are melted to bond the electrodes together with an alloy by, for example, the Au—Sn eutectic bonding, thereby producing the connection body 21 including bonding portions 22 that are composed of, for example, an Au—Sn eutectic alloy and that bond the electrodes 3 of the flexible printed circuit board 1 and the electrodes 13 of the electronic component 11 together, as illustrated in FIG. 6.

The lower limit of the hot-pressing temperature in the hot-pressing step is preferably 250° C., more preferably 270° C. The upper limit of the hot-pressing temperature is preferably 500° C., more preferably 470° C. A hot-pressing temperature of lower than the lower limit may lead to insufficient bonding strength between the electrodes. If the hot-pressing temperature is higher than the upper limit, the hot-pressing temperature is unnecessarily high, thus possibly degrading the connection body 21.

The lower limit of a pressure in the hot-pressing step is preferably 2 MPaG, more preferably 5 MPaG. The upper limit of the pressure in the hot-pressing step is preferably 50 MPaG, more preferably 30 MPaG. A pressure of less than the lower limit may lead to insufficient bonding strength between the electrodes. A pressure of more than the upper limit may lead to the degradation of the connection body 21.

The lower limit of a hot-pressing time in the hot-pressing step is preferably 0.2 seconds, more preferably 0.4 seconds. The upper limit of the hot-pressing time is preferably 20 seconds, more preferably 10 seconds. A hot-pressing time of less than the lower limit may lead to insufficient bonding strength between the electrodes. A hot-pressing time of more than the upper limit may lead to a decrease in the production efficiency of the connection body 21 and the degradation of the connection body 21.

<Advantage>

Because the method for producing a connection body includes the hot-pressing step of hot-pressing the flexible printed circuit board 1 and the electronic component 11 together, the connection body 21 having sufficiently high bonding strength between the electrodes 3 of the flexible printed circuit board 1 and the electrodes 13 of the electronic component 11 can be easily and reliably produced.

[Connection Body]

The connection body 21 including the flexible printed circuit board 1 and the electronic component 11 including the electrodes 13 electrically connected to the electrodes 3 of the flexible printed circuit board 1 will be described below with reference to FIG. 6. In the connection body 21, the electrodes 3 of the flexible printed circuit board 1 and the electrodes 13 of the electronic component 11 are bonded together with an alloy, specifically, by eutectic alloy bonding. The connection body 21 includes the bonding portions 22 that bond the electrodes 3 of the flexible printed circuit board 1 and the electrodes 13 of the electronic component 11 together.

(Bonding Portion)

The bonding portions 22 are composed of, for example, an Au—Sn eutectic alloy. The bonding portions 22 bond the main bodies 3a of the electrodes 3 of the flexible printed circuit board 1 and the electrodes 13 of the electronic component 11. The width of each of the bonding portions 22 is increased from the base-end side to the tip side of the main bodies 3a in the thickness direction and from the base-end side to the tip side of the electrodes 13 of the electronic component 11 in the thickness direction, and the maximum width is obtained at the intermediate position between each of the main bodies 3a and a corresponding one of the electrodes 13. In the case where the bonding portions 22 are composed of the Au—Sn eutectic alloy, the bonding portions 22 may have an Au content of, for example, 50% or more by mass and 95% or less by mass, preferably 60% or more by mass and 93% or less by mass. In this case, the bonding portions 22 preferably have a Sn content of 5% or more by mass and 50% or less by mass, more preferably 7% or more by mass and 40% or less by mass.

In the case where the bonding portions 22 are composed of the Au—Sn eutectic alloy, the outer-surface side portions of the electrodes 13 of the electronic component 11 are partially melted during the hot pressing to form a eutectic alloy of Au contained in the outer-surface side portions and Sn contained in the low-melting-point metal layers 3b. Thus, in the connection body 21, the outer surface of each of the electrodes 13 of the electronic component 11 is formed into an arch shape projecting toward the tip in the thickness direction. Furthermore, in the connection body 21, the outer-surface side portions of the main bodies 3a of the flexible printed circuit board 1 are partially melted during the hot pressing to form the outer surface of each of the main bodies 3a into an arch shape projecting toward the tip in the thickness direction.

<Advantage>

The connection body 21 has sufficiently high bonding strength between the electrodes because the electrodes 3 of the flexible printed circuit board 1 and the electrodes 13 of the electronic component 11 are bonded together with the alloy.

Other Embodiments

The embodiments disclosed herein are to be considered in all respects as illustrative and not limiting. The scope of the invention is defined not by the configurations of the foregoing embodiments but by the following claims, and is intended to include any modifications within the scope and meaning equivalent to the scope of the claims.

For example, the structure of the flexible printed circuit board is not particularly limited as long as the flexible printed circuit board includes the electrodes stacked on the first surface of the base film, the electrodes including the low-melting-point metal layers on the surfaces thereof, and the plate- or strip-like rigid members electrically insulated from the electrodes are disposed in the region of the second surface of the base film opposite from the electrodes.

The flexible printed circuit board does not necessarily have a two-layer structure in which conductive patterns are disposed on both sides of the base film and may be a multilayer flexible printed circuit board including three or more layers. The flexible printed circuit board may be a single-layer flexible printed circuit board that does not include a circuit pattern on the second surface of the base film.

Even in the case where the flexible printed circuit board includes both of the circuit pattern and the dummy circuit on the second surface of the base film, the circuit pattern need not necessarily be present in the region opposite from the electrodes. In this case, the dummy circuit is preferably disposed so as to contain the entire region opposite from the electrodes.

The specific structure of the electronic component of the connection body is not limited to the structures as those of described in the foregoing embodiments as long as the electronic component includes the other electrodes electrically connected to the electrodes of the flexible printed circuit board.

EXAMPLES

While the present invention will be described in more detail below by examples, the present invention is not limited to these examples. [No. 1]

(Flexible Printed Circuit Board)

A base film that was composed of a polyimide as a main component and that had an average thickness of 25 µm was provided. Electrode main bodies that had a linear shape when viewed in plan and that were composed of copper foil were stacked in parallel at an average pitch of 50 µm on a first surface of the base film. Subsequently, low-melting-point metal layers having an average thickness of 0.5 µm were stacked by electroplating using Sn as a main component on all surfaces of the electrode main bodies other than the stacking surfaces of the electrode main bodies on the base film, thereby forming plural electrodes having an average width of 30 µm and an average thickness of 30 µm. Furthermore, traces (rigid members) of a dummy circuit, the trances being composed of copper foil and having an average width of 50 µm and an average thickness of 30 µm, were stacked in parallel on a second surface of the base film at an average spacing of 100 μm so as to be parallel to the electrodes when viewed in plan. Subsequently, an adhesive layer having an average thickness (average thickness with respect to the second surface of the base film) of 50 μm and a cover layer that was composed of a polyimide as a main component and that had an average thickness of 25 μm were stacked, in this order, on surfaces of the traces of the dummy circuit (surfaces out of contact with the base film) and a portion of the second surface of the base film on which the dummy circuit was not stacked.

(Electronic Component)

Electrodes that had an average thickness of 30 μm, that were composed of gold foil, and that had the same width as the electrodes of the flexible printed circuit board were stacked in parallel on a surface of a substrate that was composed of silicon as a main component and that had an average thickness of 200 μm the electrodes being arranged at the same pitch as the electrodes of the flexible printed circuit board. Thereby, a test material mimicking an electronic component was produced.

(Connection Body)

The flexible printed circuit board and the electronic component were hot-pressed together at a pressing temperature of 400° C. and a pressure of 20 MPaG for a pressing time of 5 seconds to produce a connection body of No. 1.

[Nos. 2 to 16]

Connection bodies of Nos. 2 to 16 were produced as in No. 1, except that the average width, the average thickness, and the average pitch of the electrodes of each of the flexible printed circuit boards, the average thickness of the low-melting-point metal layers, the average width, the average thickness, and the average spacing of the traces of each of the dummy circuits, the positional relationship with the electrodes when viewed in plan, and hot-pressing conditions of the flexible printed circuit boards and the electronic components were set as given in Table 1.

[Quality of Connection Body]

<Alloy Composition>

Nos. 1 to 16 were examined by a scanning electron microscope-energy dispersive X-ray spectroscopy (SEM-EDX) for the presence or absence of Au—Sn eutectic alloy bonding between the electrodes of the flexible printed circuit boards and the electrodes of the electronic components and for alloy compositions when the Au—Sn eutectic alloy bonding was present. Table 2 lists the measurement results.

<Bonding Strength>

In Nos. 1 to 16, the electronic components were peeled off from the flexible printed circuit boards. The resulting peeled portions were visually observed. The bonding strength was evaluated according to criteria described below. Table 2 lists the evaluation results.

A: The connection portion (alloy portion) between the flexible printed circuit board and the electronic component is not broken.

B: The connection portion between the flexible printed circuit board and the electronic component is broken.

<Connection Reliability>

Nos. 1 to 16 were subjected to a heat cycling test from a minimum temperature of −40° C. to a maximum temperature of 125° C. for 1,000 cycles. The connection reliability was evaluated according to criteria described below. Table 2 lists the evaluation results.

A: A change in resistance is 10% or less of the initial value.
B: A change in resistance is more than 10% of the initial value.

<Insulation>

Nos. 1 to 16 were allowed to stand at an applied voltage of 5 V for 1,000 hours in a constant-temperature, high-humidity chamber with 85° C. and a humidity of 85%. The insulation between the electrodes was evaluated according to criteria described below. Table 2 lists the evaluation results.

A: No short circuit occurs.
B: A short circuit occurs.

TABLE 1

| | Flexible printed circuit board | | | | | | | | Connection body | | |
|---|---|---|---|---|---|---|---|---|---|---|---|
| | Electrode | | | | Dummy circuit | | | | | | |
| | | | | Average thickness | | | | | | | |
| | Average width [μm] | Average thickness [μm] | Average pitch [μm] | of low-melting-point metal layer [μm] | Average width [μm] | Average thickness [μm] | Average spacing [μm] | Positional relationship with electrode | Hot-pressing condition | | |
| | | | | | | | | | Temperature [° C.] | Pressure [MPaG] | Time [s] |
| No. 1 | 30 | 30 | 50 | 0.50 | 50 | 30 | 100 | parallel | 400 | 20 | 5 |
| No. 2 | 30 | 30 | 50 | 0.50 | 50 | 30 | 200 | parallel | 400 | 20 | 5 |
| No. 3 | 30 | 30 | 50 | 0.50 | 50 | 30 | 10 | parallel | 400 | 20 | 5 |
| No. 4 | 30 | 30 | 50 | 0.50 | 50 | 30 | 100 | perpendicular | 400 | 20 | 5 |
| No. 5 | 30 | 30 | 50 | 0.50 | 50 | 30 | 200 | perpendicular | 400 | 20 | 5 |
| No. 6 | 30 | 30 | 50 | 0.50 | 50 | 30 | 10 | perpendicular | 400 | 20 | 5 |
| No. 7 | 50 | 50 | 80 | 0.50 | 50 | 50 | 100 | parallel | 400 | 20 | 5 |
| No. 8 | 10 | 10 | 25 | 0.50 | 50 | 30 | 100 | parallel | 400 | 20 | 5 |
| No. 9 | 30 | 30 | 50 | 2.50 | 50 | 30 | 100 | parallel | 400 | 20 | 5 |
| No. 10 | 30 | 30 | 50 | 0.05 | 50 | 30 | 100 | parallel | 400 | 20 | 5 |
| No. 11 | 30 | 30 | 50 | 0.50 | 50 | 30 | 100 | parallel | 250 | 20 | 5 |
| No. 12 | 30 | 30 | 50 | 0.50 | 50 | 30 | 100 | parallel | 500 | 20 | 5 |
| No. 13 | 30 | 30 | 50 | 0.50 | 50 | 30 | 100 | parallel | 400 | 2 | 5 |
| No. 14 | 30 | 30 | 50 | 0.50 | 50 | 30 | 100 | parallel | 400 | 40 | 5 |
| No. 15 | 30 | 30 | 50 | 0.50 | 50 | 30 | 250 | parallel | 400 | 20 | 5 |
| No. 16 | 30 | 30 | 50 | 0.50 | 50 | 30 | 250 | perpendicular | 400 | 20 | 5 |

TABLE 2

|  | Alloy composition | Bonding strength | Connection reliability | Insulation |
|---|---|---|---|---|
| No. 1 | Au90% by mass Sn10% by mass | A | A | A |
| No. 2 | Au82% by mass Sn18% by mass | A | A | A |
| No. 3 | Au89% by mass Sn11% by mass | A | A | A |
| No. 4 | Au87% by mass Sn13% by mass | A | A | A |
| No. 5 | Au69% by mass Sn31% by mass | A | A | A |
| No. 6 | Au85% by mass Sn15% by mass | A | A | A |
| No. 7 | Au92% by mass Sn8% by mass | A | A | A |
| No. 8 | Au80% by mass Sn20% by mass | A | A | A |
| No. 9 | Au75% by mass Sn25% by mass | A | A | A |
| No. 10 | Au70% by mass Sn30% by mass | A | A | A |
| No. 11 | Au10% by mass Sn90% by mass | A | A | A |
| No. 12 | Au87% by mass Sn13% by mass | A | A | A |
| No. 13 | Au80% by mass Sn20% by mass | A | A | A |
| No. 14 | Au10% by mass Sn90% by mass | A | A | A |
| No. 15 | no eutectic alloy | B | B | A |
| No. 16 | no eutectic alloy | B | B | A |

[Evaluation Result]

As represented in Table 2, in each of Nos. 1 to 14, because the use of the rigid members results in sufficient uniformity of the pressure applied to the electrodes during the hot pressing, the bonding strength and the bonding reliability between the electrodes of the flexible printed circuit board and the electrodes of the electronic component and the insulation are all sufficiently high. In contrast, in each of Nos. 15 and 16, the average spacing between adjacent traces of the dummy circuit is 250 which is relatively large. This results in an insufficient pressure applied to the electrodes in a region between the traces. Thus, the eutectic alloy bonding cannot be formed between the electrodes of the flexible printed circuit board and the electrodes of the electronic component, thereby leading to insufficient bonding strength and bonding reliability between the electrodes.

REFERENCE SIGNS LIST 1 flexible printed circuit board
2 base film
3 electrode
3a main body
3b low-melting-point metal layer
4 rigid member
5 second circuit pattern
6 adhesive layer
7 cover layer
11 electronic component
12 substrate
13 electrode
21 connection body
22 bonding portion
101 flexible printed circuit board
102 base film
103 electrode
104 circuit pattern
111 electronic component
112 electrode
Z1 circuit pattern formation region
Z2 circuit pattern-free region

The invention claimed is:

1. A connection body comprising:
    a flexible printed circuit board including
        an insulating base film and a first electrode stacked on a first surface of the base film, wherein the first electrode includes a main body and a low-melting-point metal layer on a surface of the main body; and
        a plate- or strip-like rigid member electrically insulated from the first electrode disposed in a region of a second surface of the base film opposite from the first electrode;
    and
    an electronic component including a second electrode electrically connected to the first electrode,
    wherein the first electrode of the flexible printed circuit board and the second electrode of the electronic component are bonded together by a bonding portion formed of an alloy,
    wherein the alloy contains an alloy of a part of the second electrode and a metal contained in the low-melting-point metal layer,
    wherein an outer surface of the main body is formed into an arch shape projecting toward a tip of the first electrode in a thickness direction of the connection body, and
    wherein an outer surface of the second electrode of the electronic component is formed into an arch shape projecting toward a tip of the second electrode in the thickness direction of the connection body.

2. The connection body according to claim 1 further comprising a circuit pattern disposed on the second surface of the base film,
    wherein the rigid member is disposed at a position that does not overlap the circuit pattern when viewed in plan while the rigid member is electrically insulated from the circuit pattern.

3. The connection body according to claim 1, wherein the first electrode is linearly disposed when viewed in plan, the rigid member is a dummy circuit disposed parallel or perpendicularly to the first electrode when viewed in plan, and an average spacing between adjacent traces of the dummy circuit is 200 μm or less.

4. A method for producing the connection body according to claim 1, comprising:
    a hot-pressing step of hot-pressing the flexible printed circuit board and the electronic component together.

5. The connection body according to claim 1,
    wherein the bonding portion is formed of an Au—Sn eutectic alloy.

6. The connection body according to claim 1,
    wherein a width of the bonding portion increases from a base-end side to a tip side of the first electrode in the thickness direction and from a base-end side to a tip side of the second electrode in the thickness direction, and
    wherein the width of the bonding portion is maximum intermediate the base-end side of the first electrode and the base-end side of the second electrode.

7. The connection body according to claim 1, wherein the bonding portion is formed of an Au—Sn eutectic alloy having an Au content of 50% or more by mass and 95% or less by mass, and a Sn content of 5% or more by mass and 50% or less by mass.

8. The connection body according to claim 1, wherein the bonding portion is formed of an Au—Sn eutectic alloy having an Au content of 60% or more by mass and 93% or less by mass, and a Sn content of 7% or more by mass and 40% or less by mass.

\* \* \* \* \*